(12) United States Patent
Wakiya et al.

(10) Patent No.: US 7,252,883 B2
(45) Date of Patent: Aug. 7, 2007

(54) COATED PARTICLES

(75) Inventors: Takeshi Wakiya, Osaka (JP); Takeharu Morita, Osaka (JP); Hiroshi Hiraike, Osaka (JP); Katsutoshi Nagai, Yamagata (JP); Tatsuo Taniguchi, Yamagata (JP)

(73) Assignee: Sekisui Chemical Co., Ltd., Osaka (JP)

( * ) Notice: Subject to any disclaimer, the term of this patent is extended or adjusted under 35 U.S.C. 154(b) by 294 days.

(21) Appl. No.: 10/399,687

(22) PCT Filed: May 30, 2001

(86) PCT No.: PCT/JP01/04543

§ 371 (c)(1),
(2), (4) Date: Jun. 19, 2003

(87) PCT Pub. No.: WO02/35555

PCT Pub. Date: May 2, 2002

(65) Prior Publication Data

US 2004/0109995 A1    Jun. 10, 2004

(30) Foreign Application Priority Data

Oct. 23, 2000 (JP) .............................. 2000-322974
Oct. 23, 2000 (JP) .............................. 2000-322975
Feb. 5, 2001 (JP) .............................. 2001-28324

(51) Int. Cl.
*B32B 5/16* (2006.01)
(52) U.S. Cl. ...................... 428/403; 428/404; 428/407
(58) Field of Classification Search ................ 428/403, 428/407, 404
See application file for complete search history.

(56) References Cited

U.S. PATENT DOCUMENTS

| 4,042,534 | A | 8/1977 | Andrianov et al. |
| 5,162,087 | A | 11/1992 | Fukuzawa et al. |
| 5,330,684 | A | 7/1994 | Emori et al. |
| 5,565,143 | A | 10/1996 | Chan |
| 5,958,302 | A | 9/1999 | Cunningham et al. |
| 6,555,255 | B2 * | 4/2003 | Barton et al. ................ 428/690 |

FOREIGN PATENT DOCUMENTS

| EP | 0 539 211 A2 | 4/1993 |
| GB | 2 178 182 A | 2/1987 |
| GB | 2178182 A | 2/1987 |
| JP | 62-40183 A | 2/1987 |
| JP | 2-300205 A | 12/1990 |
| JP | HEI-06-302222 | 10/1994 |
| JP | 7-105716 A | 4/1995 |
| JP | 7-105725 A | 4/1995 |
| JP | 8-335407 A | 12/1996 |
| JP | HEI-11-012494 | 1/1999 |

* cited by examiner

*Primary Examiner*—Leszek Kiliman
(74) *Attorney, Agent, or Firm*—Sughrue Mion, PLLC

(57) ABSTRACT

It is an object of the invention to provide coated particles excellent in the reliability of connection.

The invention provides coated particles each comprising a metal-surfaced particle as a core and resulting from a partial surface modification of that core particle with an organic compound via a functional group (A) capable of binding to a metal.

31 Claims, No Drawings

COATED PARTICLES

TECHNICAL FIELD

The present invention relates to coated particles.

BACKGROUND ART

Anisotropic conductive particles for electric connection are used in electrode-connecting materials for liquid crystal display panels and in anisotropic conductive films in mounting LSI chips. Such anisotropic conductive films that are in use are produced, for example, by dispersing metal-plated particles in an insulating material and molding the dispersion into film-like forms. When such an anisotropic conductive film is inserted between electrodes and heated under pressure, the insulating material melts and the metal-plated particles serve as conductive particles and the electrodes are electrically connected to each other.

However, with the recent trend toward finer interelectrode pitches, it becomes necessary to increase the level of addition of conductive particles in the anisotropic conductive films for securing high levels of connection reliability. This results, however, in transverse conduction by neighboring particles, for instance, and such problems as short circuiting between neighboring electrodes arise. For alleviating such problems, Japanese Kokai Publication Sho-62-40183, for instance, describes a method which comprises coating metal-plated particles with a resin incompatible with the film layer resin and grinding the resulting mass to give particles, while Japanese Kokai Publication Hei-08-335407 describes a method which comprises coating metal-plated particles by microencapsulation. However, the methods mentioned above have drawbacks. Thus, the strength of bonding between the resin used for coating and the metal is weak, since the resin is only physically adsorbed on the metal-plated particles. In the step of grinding the aggregated particles into single and individual particles after coating treatment, the coating resin may be peeled off or the coating resin thickness may decrease, so that the metal-plated particle surface may be exposed, not only conduction in the electrode direction but also conduction in the transverse direction may occur, increasing short circuiting in the transverse direction. Another drawback of the above methods is that since a resin is layered on the metal particle surface, the laminate resin may be peeled off also in the step of kneading the coated particles with a binder resin or an adhesive. Furthermore, the resin may be peeled off from the coated particle surface even in the step of thermocompression bonding of the coated particle-containing anisotropic conductive film at elevated temperatures.

SUMMARY OF THE INVENTION

In view of the state of the art as discussed hereinabove, it is an object of the present invention to provide coated particles excellent in the reliability of connection.

The present invention consists in coated particles each comprising a metal-surfaced particle as a core and resulting from a partial modification of the surface thereof with an organic compound via a functional group (A) capable of binding to a metal as bound thereto.

Preferred as the coated particles of the invention are those resulting from grafting of an organic compound onto the metal-surfaced particle surface or those each comprising a metal-surfaced particle as a core and resulting from partial modification of the surface thereof with organic particles containing a functional group (A) capable of binding to the metal.

In cases where the coated particles of the invention each comprises a metal-surfaced particle with an organic compound grafted onto the surface thereof, the coated particles of the invention are preferably produced by introducing a compound containing a polymerizing or chain-transferring functional group or catalyst moiety (C) onto the surface of each metal-surface particle serving as a core, followed by graft polymerization with each polymerizing or chain-transferring functional group or catalyst moiety (C) as an initiation site for partial modification of the particle surface with an organic compound.

The above-mentioned graft polymerization is preferably carried out in the manner of metathesis polymerization. In particular, the technique of ring-opening metathesis polymerization using a cyclic monomer is preferred since the reaction procedure is easy to carry out.

The above-mentioned organic compound is preferably charged positively or negatively. The organic compound is preferably an insulating compound.

DETAILED DISCLOSURE OF THE INVENTION

In the following, the present invention is described in detail.

By saying "partial surface modification with an organic compound" herein, it is meant that the whole surface is not completely covered with that organic compound.

The coated particles of the invention each comprises, as a core, a particle whose surface is made of a metal (herein referred to as "metal-surfaced particles")

The above-mentioned metal is not particularly restricted but may have conductivity. Thus, it includes, among others, such metals as gold, platinum, silver, copper, iron, nickel, aluminum, and chromium; and metal compounds such as ITO and solder. Among them, gold is judiciously used because of its low resistance value.

The above-mentioned metal-surfaced particle is not particularly restricted provided that the outermost layer is made of a metal. Thus, it may be a particle made of such a metal as mentioned above alone, or a particle which is obtainable by formation of a layer of such a metal as mentioned above or a surface of a core particle made of an organic or inorganic compound by vapor deposition, plating, coating or any other appropriate technique.

The coated particles of the invention can be obtained by partial surface modification of such metal-surfaced particles to serve as cores with an organic compound via a functional group (A) capable of binding to the metal.

The functional group (A) capable of binding to the metal is not particularly restricted but may be any of those groups capable of forming an ionic bond, covalent bond or coordinate bond with the metal. Thus, it includes, among others, silane, silanol, carboxyl, amino, ammonium, nitro, hydroxyl, carbonyl, thiol, sulfonic acid, sulfonium, boric acid, oxazoline, pyrrolidone, phosphoric acid and nitrile groups. Since the use of a coordinate bond is suited to coupling to metals, S, N or P atom-containing groups are judiciously used. When the metal is gold, for instance, a thiol group capable of forming a coordinate bond with gold is judiciously used.

The organic compound is not particularly restricted but includes, among others, (un)saturated hydrocarbons, aromatic hydrocarbons, (un)saturated fatty acids, aromatic carboxylic acids, (un)saturated ketones, aromatic ketones, (un)saturated alcohols, aromatic alcohols, (un)saturated amines, aromatic amines, (un)saturated thiols, aromatic thiols, organosilicon compounds, derivatives of these, condensation products derived from one or more of these, and polymers derived from one or more of these. The term "(un)saturated" used above means "saturated and unsaturated".

As the above-mentioned condensation products or polymers, there may be mentioned, for example, polyolefins such as polyethylene and polybutadiene; polyethers such as polyethylene glycol and polypropylene glycol; polystyrene, poly(meth)acrylic acid, poly(meth)acrylic acid esters, poly(vinyl alcohol), polyvinyl esters, phenolic resins, melamine resins, allylic resins, furan resins, polyesters, epoxy resins, silicone resins, polyimide resins, polyurethanes, Teflon, acrylonitrile-styrene resins, styrene-butadiene resins, vinyl resins, polyamide resins, polycarbonates, polyacetals, polyethersulfones, polyphenylene oxide, sugars, starch, cellulose, and polypeptides. These organic compounds may be used singly or two or more of them may be used combinedly.

In cases where the coated particles of the invention are used as anisotropic conductive particles, the above organic compound is preferably selected from among insulating compounds.

The method of partial modification with such an organic compound as mentioned above is not particularly restricted but may be any method capable of coupling the organic compound to the metal surface via a functional group (A). Thus, there may be mentioned the method comprising grafting the organic compound onto the metal surface, the method comprising coupling organic particles containing a functional group (A) capable of binding to the metal, and the method comprising coating the metal surface with an organic compound and then providing the coating with micropores, for instance.

Among them, the method comprising grafting an organic compound onto the metal surface and the method comprising coupling organic particles containing a functional group (A) capable of binding to the metal are judiciously used.

Thus, the coated particles of the invention can be obtained by grafting an organic compound onto the surface of metal-surfaced particles.

The method of grafting an organic compound onto the surface of metal-surfaced particles is not particularly restricted but includes, among others, 1) the method comprising providing the organic compound with a functional group (A) capable of binding to the metal and introducing the resulting compound onto the metal surface, 2) the method comprising reacting a compound containing a functional group (A) capable of binding to the metal and a reactive functional group (B) capable of forming a covalent bond by a chemical reaction, for example a hydroxyl, carboxyl, amino, epoxy, silyl, silanol or isocyanato group, with the metal surface and then substituting the reactive functional group (B) for the organic compound by a single-stage or multistage reaction, and 3) the method comprising introducing a compound containing a polymerizing or chain-transferring functional group or catalyst moiety (C) onto the surface of metal-surfaced particles via a functional group (A) capable of binding to the metal as bound thereto and carrying out graft polymerization with each polymerizing or chain-transferring functional group or catalyst moiety (C) serving as an initiation site.

Among them, the method 3) involving graft polymerization is judiciously used.

Thus, the coated particles of the invention can be obtained by introducing a compound containing a polymerizing or chain-transferring functional group or catalyst moiety (C) onto the surface of metal-surfaced particles via a functional group (A) capable of binding to the metal as bound thereto and carrying out graft polymerization with each polymerizing or chain-transferring functional group or catalyst moiety (C) site serving as an initiation site.

The polymerizing or chain transferring functional group or catalyst (C) mentioned above is a functional group or catalyst functioning as a graft polymerization initiating site and includes, among others, radically cleavable groups such as azo and perester groups; chain transfer groups such as thiol, sulfide, dithiocarbamate, nitroxyl and halogen groups; unsaturated bond-containing groups such as vinyl, alkenyl and acetylene groups; cyclic groups such as cyclic ether, cyclic formal, lactone, lactam, cyclic iminoether, cyclic olefin, cyclic siloxane and cyclic phosphazene groups; aldehyde, ketone, isocyanato, hydroxyl, amino and carboxyl groups; and halogen compounds, oxyhalogen compounds and organic ammonium salts having one or more central metals each selected from among Li, Na, Mg, Ti, V, Cr, Fe, Co, Ni, Cu, Zr, Nb, Mo, Ru, Hf, Ta, W, Re, Os, and Ir; and organometallic compounds.

In cases where the above graft polymerization is carried out in the manner of ring-opening metathesis polymerization, however, use is made, as the above-mentioned polymerizing or chain transferring functional group or catalyst (C), of a metathesis reaction catalyst such as a chloride having, as a central metal, one species selected from among Ti, V, Cr, Zr, Nb, Mo, Ru, Ta, W, Re, Os and Ir, an organometallic compound, an alkylidene complex, a vinylidene complex or a like carbene complex or a carbyne complex. As specific examples of the metathesis reaction catalyst, there may be mentioned metal chlorides such as $TiCl_4$, $VOCl_3$, $MoCl_5$, $ReCl_5$, $IrCl_3$, $ZrCl_4$, $NbCl_5$, $WCl_6$, $RuCl_3$, $VCl_4$, $TaCl_5$, $WOCl_4$ and $OsCl_3$, organometallic compounds such as tridecylammonium molybdate, and organometallic complexes such as bis(tricyclohexylphosphine)benzylideneruthenium(IV) dichloride. Among these, those in which the central metal is ruthenium are judiciously used.

The above graft polymerization may be carried out in the manner of radical polymerization, ionic polymerization, coordination polymerization, metathesis polymerization, polycondensation reaction or polyaddition reaction, for instance, according to the polymerizing or chain transferring functional group or catalyst (C) employed. Among these, the techniques of living radical polymerization, anionic polymerization, cationic polymerization, and metathesis polymerization, by which the polymer chain length can be controlled, are judiciously used. In particular, ring-opening metathesis polymerization is more preferred because of the ease of the reaction procedure.

In ring-opening metathesis polymerization, the polymer chain length can be controlled in a relatively easy manner and the catalyst metal can be removed with ease and, unlike living polymerization, no halogen or like living controlling group will remain at any molecular terminus.

The monomer to be subjected to the above graft polymerization is not particularly restricted but may be any of those monomers which are polymerizable, for example in the manner of radical polymerization, ionic polymerization, ring-opening polymerization, isomerization polymerization, cyclization polymerization, elimination polymerization, polyaddition, polycondensation, or addition condensation. Thus, it includes, among others, ethylene, butadiene, styrene derivatives; (meth)acrylic acid, ester derivatives or amide derivatives thereof; vinyl group-containing compounds such as vinyl ester derivatives and vinyl ether derivatives; cyclic olefin-containing compounds such as cyclooctadiene and norbornene derivatives; cyclic ethers such as ethylene oxide derivatives, tetrahydrofuran derivatives and trioxane derivatives; cyclic acetals such as 1,3-dioxepane derivatives and 4H,7H-1,3-dioxepin; cyclic esters such as ε-caprolactone, glycolide and trimethylene carbonate; cyclic amines such as aziridine and 1-methylazetidine; cyclic sulfides such as propylene sulfide; oxazoline derivatives; lactams such as azetidinone, pyrrolidone and ε-caprolactam; cyclic siloxanes such as hexamethylcyclotrisiloxane; cyclic phosphazenes such as hexachlorophosphazene; aldehydes such as formaldehyde and acetaldehyde; phenol derivatives; aniline derivatives; isocyanato group-containing compounds such as hexamethylene isocyanate; hydroxyl group-containing compounds such as ethylene glycol and tetramethylene glycol; amino group-containing compounds such as hexamethylenediamine; carboxyl group-containing compounds such as adipic acid and terephthalic acid; amino acid derivatives; and urea derivatives. These monomers may be used singly or two or more of them may be used in combination.

In cases where the above graft polymerization consists in metathesis polymerization, however, the monomer to be subjected to graft polymerization is preferably one capable of metathesis polymerization. Preferred are monocyclic olefins and derivatives thereof, such as cyclobutene, cyclopentene, cyclooctene and cyclooctadiene; polycyclic olefins and derivatives thereof, such as norbornene, norbornadiene, dicyclopentadiene and tricyclopentadiene; and hetero atom-containing cyclic olefins such as 2,3-dihydrofuran, exo-3,6-epoxy-1,2,3,6-tetrahydrophthalic anhydride, 9-oxabicyclo[6.1.0]non-4-ene, exo-N-methyl-7-oxabicyclo[2.2.1]hept-5-ene-2,3-dicarboxyimide and 1,4-dihydro-1,4-epoxynaphthalene, among others. These monomers may be used singly or two or more of them may be used in combination.

In carrying out the above-mentioned graft polymerization, the organic compound to be used for surface modification of metal-surfaced particles preferably has a positive or negative charge. When the organic compound is positively or negatively charged within the molecule, repulsion occurs among organic compound molecules and intramolecularly, so that graft density control becomes easy in the step of grafting them onto the metal-surfaced particles. Furthermore, the aggregation of conductive particles can be avoided and the dispersibility thereof in the binder resin is also improved. For the above-mentioned organic compound to have a positive or negative charge within the molecule, it is preferred the molecule has a functional group on its side chain and/or at its terminus. The functional group includes ammonium, sulfonium, sulfonic acid, carboxyl, phosphoric acid, boric acid and nitrile groups, and salts of these, for instance.

The method of introducing such a functional group is not particularly restricted but may be the one comprising copolymerizing a monomer having such a functional group in the step of carrying out the polymerization reaction or the one comprising introducing such a functional group into side chains by a chemical reaction after polymerization.

In carrying out the above-mentioned graft polymerization, a chain transfer agent, a catalyst, a promoter and/or the like may be used according to need. In cases where the polymerizing or chain-transferring functional group or catalyst moiety (C)-containing compound is a metal chloride or an organometallic compound, organoaluminum compounds such as triethylaluminum, alkyllithiums such as butyllithium, organotin compounds such as dimethyltins, phenyldiazomethane, and methyl diazoacetate, for instance, may be used as the promoter.

The above polymerizing or chain-transferring functional group or catalyst moiety (C)-containing compound may be an organic compound or an inorganic compound.

The method of introducing the polymerizing or chain-transferring functional group or catalyst moiety (C)-containing compound onto the surface of the metal-surface particles is not particularly restricted but includes, among others, 3-1) the method comprising causing the polymerizing or chain-transferring functional group or catalyst moiety (C)-containing compound to contain a functional group (A) capable of binding to the metal and introducing the resulting compound onto the metal surface, 3-2) the method comprising reacting a compound containing a functional group (A) capable of binding to the metal and a reactive functional group (B) with the metal-surfaced particles and then substituting the reactive functional group (B) for the polymerizing or chain-transferring functional group or catalyst moiety (C) in one step or in a plurality of steps, and 3-3) the method comprising reacting a compound containing a group (A) capable of binding to the metal-surfaced particles with the metal-surfaced particles, then modifying the surface with a reactive functional group (B) by plasma treatment, for instance, and, further, substituting the reactive functional group (B) for the polymerizing or chain-transferring functional group or catalyst moiety (C) in one step or in a plurality of steps.

The compound to be used in introducing the polymerizing or chain-transferring functional group or catalyst moiety (C)-containing compound onto the surface of the metal-surfaced particles according to the above-mentioned method 3-1) is not particularly restricted but may be any of those which has a group (A) capable of binding to the metal-surfaced particles and a polymerizing or chain-transferring functional group or catalyst moiety (C) in one and the same molecule, for example 2,2'-azobisisobutyronitrile, 2,2'-azobisamidinodipropane dihydrochloride, mercaptophenol, mercaptohexanol, thiol-terminated poly(vinyl alcohol), 4-hydroxyphenyldimethylsulfonium methyl sulfate, mercaptopropionic acid, 2,2'-bipyridine-4,4'-dicarboxylic acid, thioctic acid, 4-imidazoleacetic acid, histidine, cysteine, methionine, p-mercaptostyrene, sodium p-styrenesulfonate, p-dimethylsulfoniophenyl methacrylate methyl sulfate, acrylonitrile, sodium bis(tricyclohexylphosphine)-p-sulfonato-benzylideneruthenium(IV) dichloride, and the like.

The above-mentioned method 3-2) of introducing the polymerizing or chain-transferring functional group or catalyst moiety (C)-containing compound onto the surface of the metal-surfaced particles is not particularly restricted but may be, for example, the one comprising introducing a compound having a reactive functional group (B), such as hydroxyl, carboxyl, amino, epoxy, silyl, silanol or isocyanato group, and a functional group (A) capable of binding to the metal onto the metal surface and then reacting the reactive functional group (B) with a compound having a functional group capable of covalent bonding with the reactive functional group (B) and having the polymerizing or chain-transferring functional group or catalyst moiety (C) to thereby effect the introduction of the polymerizing or chain-transferring functional group or catalyst moiety (C).

Specifically, there may be mentioned, among others, the method comprising introducing hydroxyl groups onto the metal-surfaced particles using mercaptophenol and then converting the groups to chlorosulfonyl groups, which are chain-transferring functional groups (C), by silane coupling using 2-(4-chlorosulfonyl)ethyltrichlorosilane; the method comprising introducing hydroxyl groups onto the metal-surfaced particles using 4-hydroxyphenyldimethylsulfonium methyl sulfate and converting those groups to vinyl groups, which are polymerizing functional groups (C), by esterification condensation using methacryloyl chloride; the method comprising introducing amino groups onto the metal-surfaced particles using histidine and then converting the same to chloro groups, which are chain-transferring functional groups (C), by addition reaction using 4-(chloromethyl)phenyl isocyanate; and the method comprising introducing hydroxyl groups onto the metal-surfaced particles using mercaptoundecanol, then converting the same to norbornene groups by silane coupling using 2-norbornene-6-methyldichlorosilane and, further, converting the same to ruthenium groups, which are chain-transferring catalyst (C) moieties, through coordination of bis(tricyclohexylphosphine)benzylideneruthenium(IV) dichloride.

The above-mentioned method 3-3) of introducing a compound having a polymerizing or chain-transferring functional group or catalyst moiety (C) onto the surface of the metal-surfaced particles is not particularly restricted but may be, for example, the method comprising introducing a compound having a functional group (A) capable of binding to the metal onto the metal-surfaced particles, then modifying a part of the compound into a reactive functional group (B) by plasma treatment or oxidation treatment, for instance, and converting the same to a polymerizing or chain-transferring functional group or catalyst moiety (C) by the method shown above with respect to the method 3-2).

The coated particles of the invention can also be obtained by the method comprising binding, to the metal surface, organic particles containing a functional group (A) capable of binding to the metal.

The above-mentioned organic particles are particles constituted of the above-mentioned organic compound.

When the partial surface modification is carried out using the organic particles mentioned above, the tendency for the conductive particles after modification to aggregate is weak, so that the load on the particles in the disaggregation step for rendering them single and individual is light and the coating organic compound is hardly peeled off.

The organic particles preferably have a positive or negative charge superficially or internally so that they may repulse one another but may not aggregate with one another.

The method of charging them positively or negatively is not particularly restricted but includes, among others, the method comprising admixing an organic or inorganic ionic compound with the above-mentioned organic particles in the step of production thereof, the method comprising introducing such compound onto the surface of the organic particles by chemical bonding, the method comprising introducing such compound onto the surface of the organic particles by physical adsorption, the method comprising ionically modifying the surface of the organic particles by chemical treatment, and the method comprising ionically modifying the surface of the organic particles by means of plasma or the like.

The method of causing the organic particles to contain a functional group (A) capable of binding to the metal is not particularly restricted but includes, among others, the method comprising admixing the same with the organic particles in the step of production thereof, the method comprising introducing the same onto the surface of the organic particles by chemical bonding, the method comprising introducing the same onto the surface of the organic particles by physical adsorption, the method comprising modifying the surface of the organic particles by chemical treatment to provide that surface with groups capable of binding to the metal, and the method comprising modifying the surface of the organic particles by means of plasma or the like to provide that surface with groups capable of binding to the metal.

The particle diameter of the organic particles is not particularly restricted but, when the coated particles of the invention are used as anisotropic conductive particles, it is preferably within the range of 1 to 2,000 nm. Within this range, the insulation between neighboring conductive particles can be secured and, when the coated particles of the invention are mutually adhered under pressure, conduction is realized.

The method of producing the above organic particles is not particularly restricted but may be any of the methods known in the art, for example, emulsion polymerization, soap-free precipitation polymerization, dispersion polymerization, suspension polymerization, and crushing of a cured resin.

The thickness of the organic layer on the coated particles of the invention as formed upon modification with the above-mentioned organic compound is not particularly restricted but may vary according to the modified area and other factors. When the coated particles of the invention are used as anisotropic conductive particles, however, the thickness is preferably 1 to 2,000 nm. Within this range, the insulation between neighboring conductive particles can be secured and, when the coated particles of the invention are mutually adhered under pressure, conduction is realized.

The percentage of the area on the coated particles of the invention as modified by the above-mentioned organic compound is not particularly restricted but may vary according to the molecular weight and structure of the modifying organic compound and the thickness of the organic layer, among others. Generally, however, it is preferably 10 to 90% of the surface area of the metal-plated particles. Within this range, the insulation between neighboring conductive particles can be secured when the coated particles of the invention are used as anisotropic conductive particles and, when the coated particles of the invention are mutually adhered under pressure, conduction is realized. A more preferred range is 20 to 90%.

The coated particles of the invention each of which comprises a metal-surface particle as a core with the surface thereof partially modified with the organic compound via a functional group (A) capable of binding to the metal as bound thereto are strong in the strength of bonding between the coating organic layer and the metal, so that the organic layer can hardly be peeled off. Therefore, when the coated particles of the invention are used as anisotropic conductive particles, high levels of connection reliability can be secured while maintaining the insulation between neighboring particles.

In cases where the surface of the metal-surfaced particles is modified with the organic compound by means of grafting, the modification area and thickness can easily be controlled, so that the modification can be adapted to the conditions of use of the coated particles. Furthermore, when the surface of the metal-surfaced particles is modified by the organic compound by means of graft polymerization, the monomer to be used can be selected, with the result that it becomes easy to control the layer structure and provide such functions as adhesiveness, tendency toward no aggregation, hydrophobicity and hydrophilicity; excellent performance characteristics can thus be exhibited.

BEST MODE FOR CARRYING OUT THE INVENTION

The following examples illustrate the present invention in more detail. These examples are, however, by no means limitative of the scope of the invention.

EXAMPLE 1

In a 1,000-mL separable flask equipped with a four-necked separable cover, stirring blade, three-way cock, condenser and temperature probe, 5 g of commercially available, thiol group-terminated poly(vinyl alcohol) (average molecular weight 20,000) was dissolved in 500 g of distilled water in an argon atmosphere.

In this solution were dispersed 10 g of gold-plated particles with a particle diameter of about 5 μm in an argon atmosphere, and the mixture was stirred at 40° C. for 12 hours. The unreacted poly(vinyl alcohol) was removed by filtration, the particles were washed with hot water and then dried to give coated particles with the surface thereof partially modified by the insulating organic compound.

EXAMPLE 2

In a 1,000-mL separable flask equipped with a four-necked separable cover, stirring blade, three-way cock, condenser and temperature probe, 5 g of commercially available, thiol group-terminated poly(methyl methacrylate) (average molecular weight 12,000) was dissolved in 500 g of tetrahydrofuran purified by distillation in an argon atmosphere.

In this solution were dispersed 10 g of gold-plated particles with a particle diameter of about 5 μm in an argon atmosphere, and the mixture was stirred at 40° C. for 12 hours. The unreacted poly(methyl methacrylate) was removed by filtration, the particles were washed with tetrahydrofuran and then dried to give coated particles with the surface thereof partially modified by the insulating organic compound.

EXAMPLE 3

In a 500-mL separable flask equipped with a four-necked separable cover, stirring blade, three-way cock, condenser and temperature probe, 99 g of methyl methacrylate, 1 g of methacrylic acid and 1.5 g of thioacetic acid were stirred together at 85° C., 0.1 g of 2,2'-azobisisobutyronitrile was then added, and the polymerization reaction was allowed to proceed for 1.5 hours. After purifying and drying, a mercapto group-terminated poly(methyl methacrylate)-methacrylic acid copolymer (average molecular weight 20,000) was obtained.

The above poly(methyl methacrylate)-methacrylic acid copolymer (5 g) was dissolved in 500 g of tetrahydrofuran purified by distillation in an argon atmosphere.

In this solution were dispersed 10 g of gold-plated particles with a particle diameter of about 5 μm in an argon atmosphere, and the mixture was stirred at 40° C. for 12 hours. The unreacted poly(methyl methacrylate)-methacrylic acid copolymer was removed by filtration, the particles were washed with tetrahydrofuran and then dried to give coated particles with the surface thereof partially modified by the insulating organic compound.

EXAMPLE 4

In a 500-mL separable flask equipped with a four-necked separable cover, stirring blade, three-way cock, condenser and temperature probe, 5 millimoles of mercaptopropionic acid was dissolved in 500 mL of tetrahydrofuran purified by distillation.

In this solution were dispersed 10 g of gold-plated particles with a particle diameter of about 5 μm in an argon atmosphere, and the mixture was stirred at 40° C. for 12 hours. The unreacted mercaptopropionic acid was removed by filtration, the particles were washed with tetrahydrofuran, then dried and again dispersed in 500 mL of tetrahydrofuran.

To this dispersion was added 5 g of commercially available, epoxy group-terminated poly(methyl methacrylate) (molecular weight 15,000) in an argon atmosphere, and the resulting mixture was stirred at 40° C. for 12 hours. The unreacted poly(methyl methacrylate) was removed by filtration, the particles were washed with tetrahydrofuran and then dried to give coated particles with the surface thereof partially modified with the insulating organic compound.

EXAMPLE 5

In a 1,000-mL separable flask equipped with a four-necked separable cover, stirring blade, three-way cock, condenser and temperature probe, 5 millimoles of mercaptoundecanol was dissolved in 500 mL of tetrahydrofuran purified by distillation.

In this solution were dispersed 10 g of gold-plated particles with a particle diameter of about 5 μm in an argon atmosphere, and the mixture was stirred at 40° C. for 12 hours. The unreacted mercaptoundecanol was removed by filtration, the particles were washed with tetrahydrofuran, then dried and again dispersed in 200 mL of distilled water.

To this dispersion was added 5 moles of hydroxymethyl methacrylate and, after thorough stirring, 10 g of a 0.1 mol/L cerric ammonium nitrate solution prepared by using a 1 N aqueous nitric acid solution, and the mixture was stirred for 10 hours. The mixture was filtered, and the particles were washed with methanol and then dried to give coated particles with the surface thereof partially modified with the insulating organic compound.

EXAMPLE 6

In a 1,000-mL separable flask equipped with a four-necked separable cover, stirring blade, three-way cock, condenser and temperature probe, 5 millimoles of mercaptophenol was dissolved in 200 mL of tetrahydrofuran purified by distillation.

In this solution were dispersed 10 g of gold-plated particles with a particle diameter of about 5 μm in an argon atmosphere, and the mixture was stirred at 40° C. for 12 hours. The unreacted mercaptophenol was removed by filtration, the particles were washed with tetrahydrofuran and then again dispersed in 500 mL of purified toluene.

To this dispersion was added 5 millimoles of 2-(4-chlorosulfonyl)ethyltrichlorosilane, and the mixture was stirred at 40° C. for 6 hours. The unreacted 2-(4-chlorosulfonyl)ethyltrichlorosilane was removed by filtration, and the particles were washed with toluene and again dispersed in purified toluene in an argon atmosphere.

To this dispersion were added 10 millimoles of copper bromide, 20 millimoles of 4,4'-di-n-heptyl-2,2'-bipyridine, 5 moles of methyl methacrylate and 2.5 millimoles of p-toluenesulfonyl chloride in an argon atmosphere, and the mixture was stirred at 90° C. for 12 hours. After cooling to room temperature, 100 g of n-hexane was added, and the particles were filtered off, further washed with n-hexane and dried to give coated particles with the surface thereof partially modified with the insulating organic compound.

EXAMPLE 7

In a 1,000-mL separable flask equipped with a four-necked separable cover, stirring blade, three-way cock, condenser and temperature probe, 5 millimoles of mercaptophenol was dissolved in 500 mL of tetrahydrofuran purified by distillation.

In this solution were dispersed 10 g of gold-plated particles with a particle diameter of about 5 µm in an argon atmosphere, and the mixture was stirred at 40° C. for 12 hours. The unreacted mercaptophenol was removed by filtration, the particles were washed with tetrahydrofuran and then again dispersed in 500 mL of purified tetrahydrofuran.

To this dispersion was added 5 millimoles of (p-chloromethyl)phenyltrichlorosilane, and the mixture was stirred at 40° C. for 6 hours. The unreacted (p-chloromethyl)phenyltrichlorosilane was removed by filtration, the particles were washed with toluene and again dispersed in purified tetrahydrofuran. To this dispersion was added 100 millimoles of sodium N,N-diethyldithiocarbamate, and the mixture was stirred at room temperature for 18 hours. The unreacted sodium N,N-diethyldithiocarbamate was removed by filtration, the particles were washed with toluene and again dispersed in purified toluene in an argon atmosphere. To this dispersion were added 2 millimoles of methyl methacrylate and 0.02 millimole of methacrylic acid in an argon atmosphere, and the mixture was irradiated with light from a high-pressure mercury lamp (product of SEN Light: HLR 100T-1) used as a light source with stirring at 40° C. for 3 hours. After cooling to room temperature, the particles were filtered off, washed with n-hexane and dried to give coated particles with the surface thereof partially modified with the insulating organic compound.

EXAMPLE 8

In a 1,000-mL separable flask equipped with a four-necked separable cover, stirring blade, three-way cock, condenser and temperature probe, 5 millimoles of mercaptoundecanol having a thiol group was dissolved in 500 mL of tetrahydrofuran purified by distillation.

In this solution were dispersed 10 g of gold-plated particles with a particle diameter of about 5 µm in an argon atmosphere, and the mixture was stirred at 40° C. for 12 hours. The unreacted mercaptoundecanol was removed by filtration, the particles were washed with tetrahydrofuran, then dried and dispersed in 500 mL of toluene.

To this dispersion was added 5 millimoles of 2-norbornene-6-methyldichlorosilane, and the reaction was carried out with stirring at 40° C. for 6 hours for conversion of the hydroxyl group to the norbornene group. The unreacted 2-norbornene-6-methyldichlorosilane was removed by filtration, and the particles were washed with toluene and again dispersed in 500 mL of purified toluene in an argon atmosphere. To this dispersion was added 5 millimoles of bis(tricyclohexylphosphine)benzylideneruthenium(IV) dichloride as a metathesis polymerization catalyst, and the reaction was carried out at room temperature for 30 minutes for conversion of the norbornene group to the ruthenium carbene group. The unreacted bis(tricyclohexylphosphine)benzylideneruthenium(IV) dichloride was removed by filtration, the particles were washed with toluene and again dispersed in 400 mL purified toluene in an argon atmosphere. To this dispersion was added, as a monomer to be subjected to graft polymerization, 2 millimoles of norbornene dissolved in 100 mL of purified toluene in an argon atmosphere, and the graft polymerization was carried out at room temperature for 30 minutes. The particles were filtered off, washed with methanol and then dried to give coated particles with the surface thereof partially modified with the insulating organic compound.

EXAMPLE 9

Styrene (500 millimoles), 5 millimoles of methacryloyloxyphenyldimethylsulfoniummethylsulfate, 5 millimoles of 2,2'-azobis(2-amidinopropane) dihydrochloride and 250 mL of distilled water were weighed and placed in a 1,000-mL separable flask equipped with a four-necked separable cover, stirring blade, three-way cock, condenser and temperature probe, and the mixture was stirred at 200 rpm and the polymerization was carried out at 60° C. for 7 hours in a nitrogen atmosphere to give an 18% dispersion of latex particles having sulfonium groups on the surface thereof and having an average particle diameter of 220 nm.

The above latex particle dispersion was diluted to 1% with distilled water, 10 g of gold-plated particles with a particle size of 5 µm were dispersed in 500 mL of the dilution in an argon atmosphere, and the mixture was stirred at 40° C. for 12 hours. The mixture was filtered through a 3-µm-mesh filter, and the particles were further washed with methanol and dried to give coated particles with the surface thereof partially modified with the insulating organic particles.

EXAMPLE 10

Styrene (500 millimoles), 1.92 millimoles of sodium p-styrenesulfonate, 0.94 millimole of potassium persulfate and 475 mL of distilled water were weighed and placed in a 100-mL separable flask equipped with a four-necked separable cover, stirring blade, three-way cock, condenser and temperature probe, and the mixture was stirred at 200 rpm and the polymerization was carried out at 60° C. for 12 hours in a nitrogen atmosphere to give a 10% dispersion of latex particles having sulfonic acid groups on the surface thereof and having an average particle diameter of 105 nm.

The above latex particle dispersion was diluted to 1% with distilled water, 10 g of gold-plated particles with a particle size of 5 µm were dispersed in 500 mL of the dilution in an argon atmosphere, and the mixture was stirred at 40° C. for 12 hours. The mixture was filtered through a 3-µm-mesh filter, and the particles were further washed with methanol and dried to give coated particles with the surface thereof partially modified with the insulating organic particles.

EXAMPLE 11

Styrene (250 millimoles), 250 millimoles of glycidyl methacrylate, 5 millimoles of 2,2'-azobis(2-amidinopropane) dihydrochloride and 549 mL of distilled water were weighed and placed in a 100-mL separable flask equipped with a four-necked separable cover, stirring blade, three-way cock, condenser and temperature probe, and the mixture was stirred at 200 rpm and the polymerization was carried out at 70° C. for 2 hours in a nitrogen atmosphere. Then, 40 millimoles of glycidyl methacrylate was added, and the polymerization was carried out for further 12 hours to give a 10% dispersion of latex particles having sulfonic acid groups on the surface thereof and having an average particle size of 120 nm.

To this latex particle dispersion was added 250 millimoles of 3-mercaptopropionic acid, and the reaction was carried out under reflux for 5 hours. The particles were washed by centrifugation and diluted with distilled water to give a 10% dispersion of latex particles having thiol groups on the surface thereof and having an average particle diameter of 120 nm.

In 100 mL of this latex particle dispersion were dispersed in an argon atmosphere 5 g of gold-plated particles with a particle size of about 5 μm, and the mixture was stirred at 40° C. for 12 hours. The mixture was filtered through a 3-μm-mesh filter, and the particles were further washed with methanol and dried to give coated particles with the surface thereof partially modified with the insulating organic particles.

COMPARATIVE EXAMPLE 1

In a 1,000-mL separable flask equipped with a four-necked separable cover, stirring blade, three-way cock, condenser and temperature probe, 5 g of poly(vinyl alcohol) (average molecular weight 10,000) was dissolved in 500 g of distilled water in an argon atmosphere.

In this solution were dispersed 10 g of gold-plated particles with a particle diameter of about 5 μm in an argon atmosphere, and the mixture was stirred at 40° C. for 12 hours. The unreacted poly(vinyl alcohol) was removed by filtration, the particles were washed with hot water and then dried to give coated particles with the surface thereof wholly modified with the insulating organic compound.

COMPARATIVE EXAMPLE 2

Ten grams of gold-plated particles with a particle diameter of about 5 μm and 5 g of a vinylidene fluoride resin were introduced into a hybridization apparatus and treated at 90° C. for 3 hours to give coated particles with the surface thereof partially modified with the insulating organic compound.

(Evaluations)

The coated particles obtained in Examples 1 to 11 and Comparative Examples 1 and 2 were measured for organic coating layer thickness and for coverage, namely the percent of organic compound-coated area on the metal-surfaced particle surface.

Then, each coated particle species was treated with a jet mill (product of Nisshin Engineering: Current Jet CJ-2.5) under the action of a force of 1 N/cm$^2$ or 5 N/cm$^2$ for conversion to a state of individual particles occurring singly and independently, followed by coverage measurement. The presence or absence of aggregates after jet mill treatment was judged by the eye. The results thus obtained are shown in Table 1.

TABLE 1

|  | | Before conversion to single particles | | Presence or absence of aggregates and coverage after jet mill treatment | | | |
| --- | --- | --- | --- | --- | --- | --- | --- |
|  | | Coating organic | | 1 N/cm$^2$ | | 5 N/cm$^2$ | |
|  | Coating organic compound species | layer thickness | Coverage | Aggregates | Coverage | Aggregates | Coverage |
| Example 1 | Poly(vinyl alcohol) | 15 nm | 65% | Found | 65% | Not found | 65% |
| Example 2 | Poly(methyl methacrylate) | 10 nm | 65% | Found | 65% | Not found | 65% |
| Example 3 | Methyl methacrylate-acrylic acid copolymer | 15 nm | 60% | Found | 60% | Not found | 60% |
| Example 4 | Poly(methyl methacrylate) | 12 nm | 67% | Found | 67% | Not found | 67% |
| Example 5 | Poly(hydroxymethyl methacrylate) | 20 nm | 72% | Found | 72% | Not found | 72% |
| Example 6 | Poly(methyl methacrylate) | 22 nm | 80% | Found | 80% | Not found | 79% |
| Example 7 | Poly(methyl methacrylate) | 25 nm | 82% | Found | 82% | Not found | 81% |
| Example 8 | Poly(norbornene) | 30 nm | 77% | Found | 77% | Not found | 77% |
| Example 9 | Surface sulfonium-polystyrene particles | — | 43% | Not found | 41% | Not found | 12% |
| Example 10 | Surface sulfonic acid-polystyrene particles | — | 58% | Not found | 57% | Not found | 25% |
| Example 11 | Surface thiol-poly(methyl methacrylate) particles | — | 69% | Not found | 69% | Not found | 32% |
| Compar. Ex. 1 | Poly(vinyl alcohol) | 15 nm | ~100% | Found | 65% | Not found | 18% |
| Compar. Ex. 2 | Poly(vinylidene fluoride) | 15 nm | 65% | Found | 58% | Not found | 20% |

As can be seen from Table 1, the coated particles obtained in Comparative Examples 1 and 2 showed marked decreases in coverage in the step of conversion to single individual particles whereas the decreases in coverage were small with the coated particles obtained in Examples 1 to 11; in particular, the coated particles obtained in Examples 1 to 8 showed almost no decreases in coverage.

Even when jet mill treatment was carried out with a small force, no aggregates were observed among the coated particles obtained in Examples 9 to 11.

INDUSTRIAL APPLICABILITY

The present invention, which has the constitution described above, can provide coated particles excellent in the reliability of connection.

The invention claimed is:

1. A coated conductive particle, which comprises a conductive metal-surfaced particle obtained by formation of a conductive metal layer on the surface of a core particle made of an organic compound and results from a partial modification of the surface of the conductive metal-surfaced particle with an organic compound via a functional group (A) bound to the metal.

2. The coated conductive particle according to claim 1, wherein the surface of the conductive metal-surfaced particle has the organic compound grafted thereon.

3. The coated conductive particle according to claim 2, wherein the surface of the conductive metal-surfaced particle is partially modified with an organic compound by introducing thereonto a compound having a polymerizing or chain-transferring functional group or catalyst moiety (C), followed by graft polymerization with each polymerizing or chain-transferring functional group or catalyst moiety (C) site as an initiation site.

4. The coated conductive particle according to claim 3, wherein the graft polymerization is carried out in the manner of ring-opening metathesis polymerization.

5. The coated conductive particle according to claim 1, which comprises the conductive metal-surfaced particle and results from a partial modification of the surface thereof with an organic particle containing a functional group (A) by binding the functional group (A) to the metal.

6. The coated conductive particle according to claim 1, wherein the outer organic compound has a positive or negative charge.

7. The coated conductive particle according to claim 1, wherein the outer organic compound is an insulating compound.

8. The coated conductive particle according to claim 1, wherein the functional group (A) is bound to the metal by coordinate bond.

9. An anisotropic coated conductive particle, which comprises a conductive metal-surfaced particle obtained by formation of a conductive metal layer on the surface of a core particle made of an organic compound and resulting from a partial modification of the surface of the conductive metal-surfaced particle with an insulating organic compound via a functional group (A) bound to the metal.

10. The anisotropic coated conductive particle according to claim 9, wherein a thickness of an organic layer as formed upon partial surface modification with the insulating organic compound is 1 to 2,000 nm.

11. The anisotropic coated conductive particle according to claim 9, wherein the conductive metal-surfaced particle is a metal-plated particle, and the percentage of the area on the metal-plated particle modified by the insulating organic compound is 10 to 90% of the surface area of the metal-plated particle.

12. The coated conductive particle according to claim 2, wherein the outer organic compound has a positive or negative charge.

13. The coated conductive particle according to claim 3, wherein the outer organic compound has a positive or negative charge.

14. The coated conductive particle according to claim 4, wherein the outer organic compound has a positive or negative charge.

15. The coated conductive particle according to claim 5, wherein the outer organic compound has a positive or negative charge.

16. The coated conductive particle according to claim 2, wherein the outer organic compound is an insulating compound.

17. The coated conductive particle according to claim 3, wherein the outer organic compound is an insulating compound.

18. The coated conductive particle according to claim 5, wherein the outer organic compound is an insulating compound.

19. A coated conductive particle, which comprises a conductive metal-surfaced particle as a core and results from a partial modification of the surface thereof with an organic compound via a functional group (A) bound to the metal, wherein the conductive metal is at least one selected from the group consisting of gold, platinum, silver, copper, iron, nickel, aluminum, chromium, and solder.

20. The coated conductive particle according to claim 19, wherein the surface of the conductive metal-surfaced particle has the organic compound grafted thereon.

21. The coated conductive particle according to claim 20, wherein the surface of the conductive metal-surfaced particle as a core is partially modified with an organic compound by introducing thereonto a compound having a polymerizing or chain-transferring functional group or catalyst moiety (C), followed by graft polymerization with each polymerizing or chain-transferring functional group or catalyst moiety (C) site as an initiation site.

22. The coated conductive particle according to claim 21, wherein the graft polymerization is carried out in the manner of ring-opening metathesis polymerization.

23. The coated conductive particle according to claim 19, which comprises the conductive metal-surfaced particle as the core and results from a partial modification of the surface thereof with an organic particle containing a functional group (A) by binding the functional group (A) to the metal.

24. The coated conductive particle according to claim 19, wherein the organic compound has a positive or negative charge.

25. The coated conductive particle according to claim 19, wherein the organic compound is an insulating compound.

26. The coated conductive particle according to claim 19, wherein the conductive metal-surfaced particle is made of a metal alone.

27. The coated conductive particle according to claim 19, wherein the conductive metal-surfaced particle is obtained by formation of a conductive metal layer on the surface of a core particle.

28. The coated conductive particle according to claim 19, wherein the functional group (A) is bound to the metal by coordinate bond.

29. An anisotropic coated conductive particle, which comprises a conductive metal-surfaced particle as a core and results from a partial modification of the surface thereof with an insulating organic compound via a functional group (A) bound to the metal, wherein the conductive metal is at least one selected from the group consisting of gold, platinum, silver, copper, iron, nickel, aluminum, chromium, and solder.

30. The anisotropic coated conductive particle according to claim 29, wherein a thickness of an organic layer as formed upon partial surface modification with the insulating organic compound is 1 to 2,000 nm.

31. The anisotropic coated conductive particle according to claim 29,
wherein the conductive metal-surfaced particle is a metal-plated particle obtained by formation of a conductive metal layer of a surface of a core particle, and the percentage of the area on the metal-plated particle modified by the insulating organic compound is 10 to 90% of the surface area of the metal-plated particle.

* * * * *